(12) United States Patent
Hurlock et al.

(10) Patent No.: US 7,502,728 B1
(45) Date of Patent: *Mar. 10, 2009

(54) CODE COVERAGE TESTING IN HARDWARE EMULATION

(75) Inventors: Steven T. Hurlock, Wynnewood, PA (US); Stephen Kun, Lueder (DE); Robert A. Johnson, Pottstown, PA (US); Jeremy S. Nichols, Minneapolis, MN (US); Arthur J. Nilson, Phoenixville, PA (US)

(73) Assignee: Unisys Corporation, Blue Bell, PA (US)

( * ) Notice: Subject to any disclaimer, the term of this patent is extended or adjusted under 35 U.S.C. 154(b) by 481 days.

This patent is subject to a terminal disclaimer.

(21) Appl. No.: 10/324,462

(22) Filed: Dec. 20, 2002

Related U.S. Application Data (60) Provisional application No. 60/376,604, filed on Apr. 30, 2002.

(51) Int. Cl.
G06F 9/455 (2006.01)
G06F 17/50 (2006.01)

(52) U.S. Cl. .............................. 703/23; 703/13; 703/14; 703/15; 703/16; 717/126; 717/134; 717/135; 717/141; 717/154; 717/158

(58) Field of Classification Search ............... 703/23, 703/13–16; 717/106, 122, 134, 115, 124, 717/130, 138, 30, 126, 135, 141, 154, 158; 714/30

See application file for complete search history.

(56) References Cited

U.S. PATENT DOCUMENTS 5,680,332 A * 10/1997 Raimi et al. ................. 703/13
6,141,630 A * 10/2000 McNamara et al. ........... 703/14
6,173,241 B1 * 1/2001 Trimberger ................... 703/13
6,223,144 B1 * 4/2001 Barnett et al. ................ 703/22
6,314,529 B1 * 11/2001 Rana ........................... 714/29
6,336,087 B2 * 1/2002 Burgun et al. ................ 703/15

(Continued)

FOREIGN PATENT DOCUMENTS

WO    WO 01/40941    6/2001

OTHER PUBLICATIONS

Pradip A. Thaker, Vishwani D. Agrawal, and Mona E. Zaghloul, Validation Vector Grade (VVG): A New Coverage Metric for Validation and Test, A PhD Candidate at George Washington University, 1999.*

(Continued)

*Primary Examiner*—Kamini S Shah
*Assistant Examiner*—Kibrom K Gebresilassie
(74) *Attorney, Agent, or Firm*—Richard J. Gregson; Robert P. Marley; Woodcock Washburn, LLP (57) ABSTRACT

Code coverage questions are addressed by a code coverage method that instruments an electronic module source design file with coverage probes and gives hierarchical names to the probes, then provides therefrom an instrumented gate level netlist. The instrumented netlist is run on a hardware emulator, executing reset trigger scripts to reset the branch and statement probes, and then a fully initialized design is driven in emulation on a simulated testbench from which the probe values are retrieved. These values can then be evaluated to determine the extent of code coverage. Various forms of coverage are supported including branch, statement, reset trigger and toggle coverage.

18 Claims, 7 Drawing Sheets

U.S. PATENT DOCUMENTS

| | | | |
|---|---|---|---|
| 6,430,741 B1* | 8/2002 | Mattson et al. | 717/154 |
| 6,618,839 B1* | 9/2003 | Beardslee et al. | 716/4 |
| 6,629,297 B2* | 9/2003 | Ganesan et al. | 716/5 |
| 6,636,995 B1* | 10/2003 | Dean et al. | 714/724 |
| 6,658,651 B2* | 12/2003 | O'Brien et al. | 717/127 |
| 6,691,079 B1* | 2/2004 | Lai et al. | 703/16 |
| 6,698,012 B1* | 2/2004 | Kossatchev et al. | 717/126 |
| 6,721,941 B1* | 4/2004 | Morshed et al. | 717/127 |
| 6,766,473 B2* | 7/2004 | Nozuyama | 714/33 |
| 6,836,877 B1* | 12/2004 | Dupenloup | 716/18 |
| 6,990,438 B1* | 1/2006 | Chowdhury et al. | 703/13 |
| 7,065,481 B2* | 6/2006 | Schubert et al. | 703/14 |
| 7,089,535 B2* | 8/2006 | Bates et al. | 717/130 |
| 7,100,152 B1* | 8/2006 | Birum et al. | 717/131 |
| 7,117,458 B1* | 10/2006 | Hurlock | 716/4 |
| 7,292,970 B1* | 11/2007 | Hurlock | 703/23 |
| 2001/0011212 A1* | 8/2001 | Raynaud et al. | 703/22 |
| 2002/0095660 A1* | 7/2002 | O'Brien et al. | 717/127 |
| 2003/0131325 A1* | 7/2003 | Schubert et al. | 716/4 |
| 2003/0188301 A1* | 10/2003 | Bates et al. | 717/158 |
| 2004/0025122 A1* | 2/2004 | Schubert et al. | 716/4 |
| 2004/0044514 A1* | 3/2004 | Granny et al. | 703/23 |
| 2005/0022166 A1* | 1/2005 | Wolff et al. | 717/124 |
| 2005/0160405 A1* | 7/2005 | Lunia et al. | 717/124 |

OTHER PUBLICATIONS

C. N. Liu and J. Y. Jou, "efficient coverage analysis metric for HDL design validation," IEEE 2001, pp. 1-6.*

Pradip A. Thaker, Vishwani D. Agrawal, and Mona E. Zaghloul, "Validation Vector Grade (VVG): A New Coverage Metric for Validation and Test", PhD candidate at George Washington, 1999,total number of pp. 7 and extra page shows the creation of the PDF file.*

J. Y. Jou, and C. N. J. Liu, "Coverage Analysis Techniques for HDL Design Validation" 1999.*

"IPL from Testing Tools Report" 1998.*

* cited by examiner

CODE COVERAGE TESTING IN HARDWARE EMULATION

CROSS-REFERENCE TO OTHER APPLICATIONS

The present application claims priority to Provisional Application Ser. No. 60/376,604 filed 30 Mar. 2002 which is incorporated herein by reference in its entirety. The present application contains subject matter related to U.S. application Ser. No. 10/324,608 now U.S. Pat. No. 7,117,458 and U.S. application Ser. No. 10/324,451 now U.S. Pat. No. 7,292,970, both of which were filed on 20 Dec. 2002 and are also incorporated herein by reference in their entireties.

BACKGROUND OF THE INVENTION

1. Field of the Invention

This invention relates generally to hardware design for high density logic circuits and has particular application to code testing in design development.

2. Background

Code coverage is a computationally intense activity involved in hardware emulation used in the hardware design process.

Code coverage testing is a boon to designers because it clearly identifies portions of the design under test that have not been adequately exercised during testing. However, extraction of signals relevant to code coverage depending on the design itself to give up its hidden circuit pathways has not yielded good results. Accordingly, some way to insert circuits, i.e., instruments, to capture signals at any relevant location within the design needed to be developed. Counter to the need to insert instruments, or to instrument the design is the problems that additional circuits in the design can cause. The running of emulations with the greatly increased design size becomes an insurmountable problem when the design is large to begin with, so even though the signals could be read out from a fully instrumented design, the emulators typically were not large or fast enough to be of use for large circuit designs.

Code coverage has been available for simulation, but not emulators in the past. Users need to be able to have better and more reliable code coverage which can only be achieved in emulation where at speed and other potentially difficult conditions can be explored, unlike simulation which does not provide for any real world test conditions.

SUMMARY OF THE INVENTION

This invention addresses these problems by making available selective instrumentation to the user and by limiting the emulation runs to smaller netlists. Generally the user will select an appropriate sized netlist by picking a module of interest for the design source file that is likely to be within the range of capacity for the emulator he is going to be using. An HDL (VHDL, Verilog, etc.) source is instrumented with coverage probes; a hierarchical name is generated for each instantiated probe; the instrumented HDL source is compiled/synthesized into a gate-level netlist; the list of hierarchical names is used to generate two scripts: a reset trigger script, and a probe value extraction script; the instrumented netlist is loaded onto a hardware emulator. If the emulator capacity is exceeded a smaller module is selected and only that module is run. The emulation run is initialized, then the generated reset trigger script is executed to reset coverage probes. We call the probes we discuss herein branch, toggle, and statement probes. The fully initialized design is then driven by a software testbench; after the testbench has completed, the generated extraction script is run to retrieve the probe values from the emulator; the extracted probe values are saved in a valid input format for use by a code coverage tool; the code coverage tool produces reports detailing how much of the design has been exercised, using the various code coverage techniques.

Coverage can be thought of in parts; Branch coverage, which itself can be described in three parts: Standard, For-Loop and For-Generate; and the additional parts are Statement coverage; and Toggle Coverage. A reset trigger is also included in the description.

BRIEF DESCRIPTION OF THE FIGURES

The present invention is described with reference to the accompanying drawings which are at the pages in the specification mentioned in the paragraphs that follow. This specification is called the "Tuscany/CoBALT Design v2.0" document of Apr. 26, 2002. Upon filing of a formal application these drawings will be filed in accord with the requirements for formal drawings.

DETAILED DESCRIPTION OF THE PREFERRED EMBODIMENTS

While various embodiments of the present invention are described, it should be understood that they have been presented by way of example only, and not as a limitation. Thus, the breadth and scope of the present invention should not be limited by any of the above-described exemplary embodiments, but should be defined only in accordance with the following Claims and their equivalents.

Functional Design

System Components

The present application contains subject matter common to U.S. application Ser. No. 10/324,608 now U.S. Pat. No. 7,117,458 entitled "Identifying Specific Netlists for use in Code Coverage Testing" and U.S. application Ser. No. 10/324,451 now U.S. Pat. No. 7,292,970 entitled "Finding Unexercised Logic for use in Code Coverage Testing", both of which were filed on 20 Dec. 2002 and both of which are incorporated herein by reference in their entireties.

Figure 1:
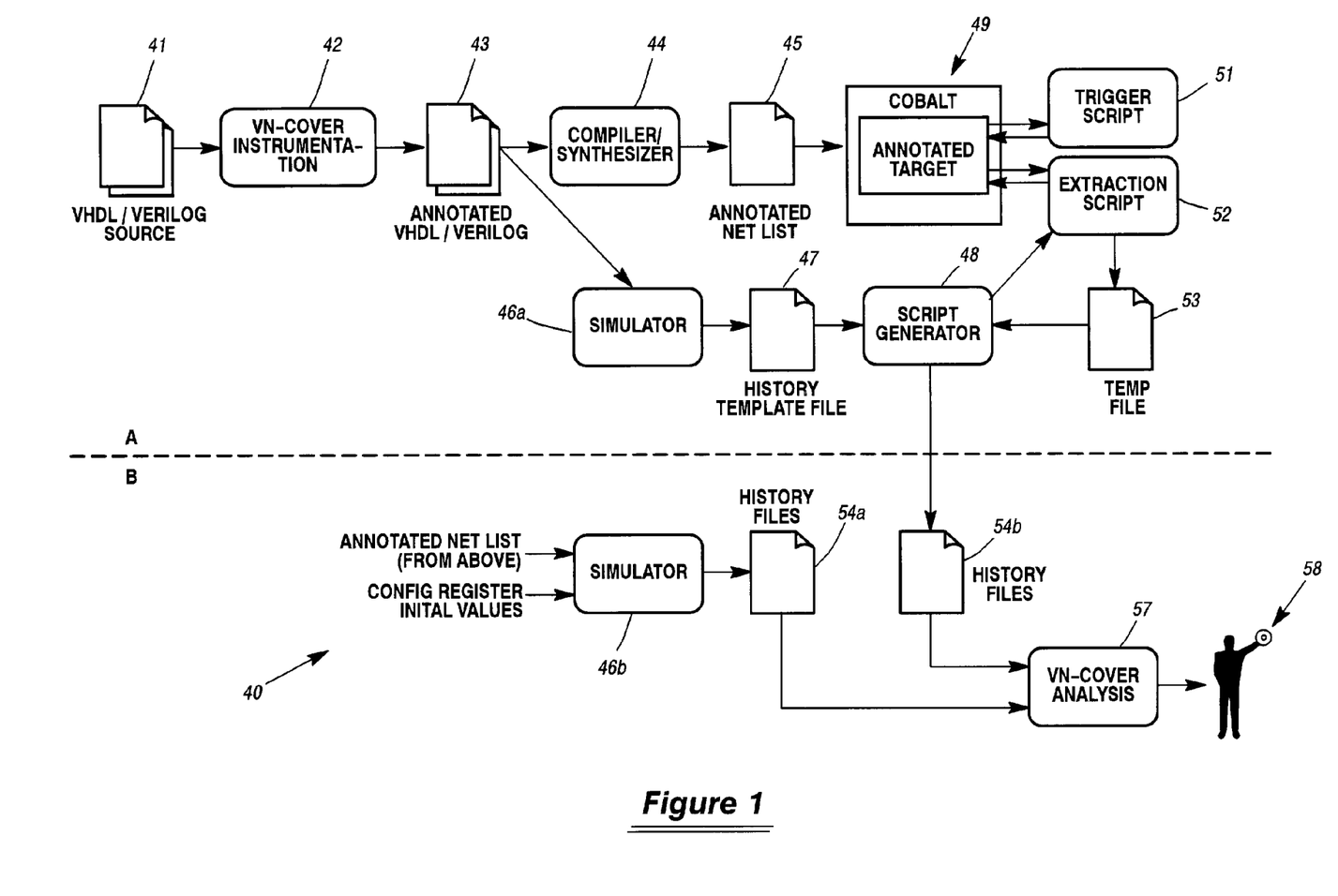
FIG. 1 is a flow diagram.

Refer first to FIG. 1, the flow schematic diagram 40. In this figure, it can be seen that the production of the data file (illustrated here on a disk 58 being held by an appreciative human stick figure) begins with the production of the VHDL\Verilog source files 41. In order to implement the inventions the source file is instrumented in step 42 to create an annotated source file 43 The instrumentation in the preferred embodiment is done using the VN-Cover tool from TransEDA, but other similar tools could be used. (VN stands for Verification Navigation). The annotated source files 43 are sent to a simulator 46a to give us all the names of the registers we will want to look at, based on the annotations that were made The simulator will produce a history template file 47 as a result. Preferably contemporaneously with the simulation, we run a compiler/synthesizer 44 to produce the annotated net list 45 from the VHDL Verilog files 43, so that the CoBALT engine 49 has something to work with that it understands. The upper flow of processes and software is the Emulation Flow. Trigger Scripts 51 and Extraction scripts 52 interact with the annotated target in CoBALT to improve it to the point where a properly annotated Temp File 53 is created to form the basis for ultimate coverage analysis in block 57. The extraction scripts 52 are created in a script generator 48 that produces a script based on the files input to it (47 and 53) The first file is the history template file 47, created through the simulation 46a and 46b. After this is used to create an extraction script and that is run on the target in CoBALT (i.e., performing the emulation), a temporary file 53 is created that holds the data on which circuits we want to look at. The script generator 48 merges the history template file 47 with coverage values from the temp file 53 to produce a history file 54b The annotated netlist 45 is simulated by the simulator 46b to produce history file 54b which identifies all tied coverage probes, i.e, probes that are tied to either "covered" or "uncovered" states due to constant signals, or tied to registers in the design. (The history file 54a produced by simulator 46b is actually a temp file in the format of temp file 53 in the current embodiment, but implementation details such as this may be varied by the user). The simulation done in simulator 46a should be run through all register values to produce a complete history file as would be expected by one in this art. These two history files are merged during VN-Cover analysis 57 as they are used as the basis for the code coverage analysis. The coverage results 58 have the tied coverage probes optionally either highlighted or filtered out, depending on how the user will want to use the data.

Below, we define some of these components individually.

VN-Cover Instrumentation (42)

Preferred embodiment instrumentation is performed by TransEDA's vnvhdl and vnvlog tools which instrument the VHDL and Verilog source, respectively, with the coverage probes. Software form other vendors with similar features could be used.

Compiler/Synthesizer (44)

For the preferred embodiment we use a Unisys developed RTL-to-gate translation process, based on either of the commercially available tools, Synopsis Design Compiler or Quickturn HDL-ICE. Annotated code must be synthesizable by some software tool, but the particular process by which the translation from the RTL or similar design files to gate design files is not essential to the invention.

Simulator (46a, 46b)

A software simulator 46a, such as Leapfrog or NC-Sim, is used to load the instrumented design. The TransEDA PLI traverses the design, detecting instances of instrumented modules, and writes a history template file (47) which records the hierarchical name of instrumented instances and the coverage probes they contain. It also provides an estimate of the additional gates and latches added to the design by the instrumentation process. It is preferably used again 46b (or an alternative simulator may be used) to find the unexercised logic in the annotated net list as described in detail in related patent, identified above.

Script Generator (48)

The script generator is a piece of software that reads the history template file and generates two scripts: a reset script, and an extractor script. The reset script is a Tcl script executed after the emulation run initializes in order to reset all of the coverage registers. (Tcl or Tool Command Language) is a well known open-source script generator programming language. The extractor Tcl script executes after the emulation run finishes to extract the coverage register values. The script generator is also used in a separate phase to convert the temporary file 53 generated by the extractor script 52 into a history file 56 which is readable by VN-Cover 57. One of ordinary skill in these arts can easily and without undue experimentation build such script generators.

VN-Cover Results Analysis (57)

The standard TransEDA VN-Cover analysis tools (and possibly other post-processing tools) analyze the generated history file and output coverage reports.

Probe Generation Method

The method for generating synthesizable probes is accomplished using a set of custom components that are instantiated where needed. The implementation of this component may be different for different emulators or simulators. Three types of probes are generated: branch probes, statement probes, and toggle probes.

Branch probes record the execution of statements in conditional blocks, e.g. in if-else statements, case statements and in VHDL conditional and selected assignment statements. Statement probes record the execution of concurrent statements selected via CoBALT-valid sensitivity lists. Toggle probes record the rising (zero-to-one) and falling (one-to-zero) transitions of signals. All types of probes require a delayed trigger mechanism, which resets the probes' states to the "unencountered" value after the emulation run has been initialized.

Appendix A contains the component definitions for the VNemulator library. Appendix B follows an example design through the entire process flow, and documents each of the files generated during the coverage generation and analysis process.

The vnemulator Library

The vnemulator library is a set of custom VHDL components which are used to support code coverage collection on an emulator. Instances of these components are inserted into the design during instrumentation.

VNEMULATOR_TRIGGER Component

The VNEMULATOR_TRIGGER component is instantiated once per instrumented module. Having one per instrumented module duplicates some state but simplifies the instrumentation program since it does not need to add any ports or make any hierarchy. This component contains state that is used to provide control signals to the other instrumentation components in the instrumented module, such as a reset signal for slatches or enable_capture/enable_compare signals for the statement probe implementation. The following vhdl and circuit diagram show the implementation of the TRIGGER with just the reset logic, the implementation for signals used by the statement probe will be discussed below.

The module has an optimization to allow minimized involvement from the using in issuing the reset. It uses a "cobalt_unit_delay" which delays a given signal by one emulation unit of time in CoBALT, which is the amount of time to propagate a signal through a latch in CoBALT. To issue a reset pulse, the user runs a Tcl script that sets the reset latch in each trigger module in the design. When the design executes the latch will be immediately reset which causes the smallest possible pulse and removes the need for another script to reset the latch. On CoBALT, the latch will initially have a value of '0'. This code produces the block diagram circuit illustrated in FIG. 1.

entity VNEMULATOR_TRIGGER is
port (
    reset : buffer bit :='0'
);

```
end;
architecture RTL of VNEMULATOR_TRIGGER is
signal delay_reset :bit;
component COBALT_UNIT_DELAY
    port (
        A: in bit;
        Z: out bit
    );
end component;
-- pragma synthesis off
for all : COBALT_UNIT_DELAY use entity work.
    COBALT_UNIT_DELAY(RTL);
-- pragma synthesis_on
begin
    UQ_DELAY : COBALT_UNIT_DELAY port map
        (A=>reset, Z=>delay_reset);
    process (delay_reset)
    begin
        if delay_reset'event and delay_reset='1' then
            reset <='0';
        end if;
    end process;
end;
```

VNEMULATOR_SLATCH Component

An instance of this component is used to latch the value of a branch-cover probe. The VHDL for the latch is given below:

```
entity VNEMULATOR_SLATCH is
    port (
        reset :in bit;
        s :in bit;
        q :out bit
    );
end;
architecture RTL of VNEMULATOR_SLATCH is
begin
    state_p : process (reset, s)
    begin
        if reset = '1' then
            q <= '0';
        elsif s'event and s = '1' then
            q <='1';
        end if,
    end process;
end;
```

The functionality of the latch is such that a transition to '1' on the IN port, s, causes a '1' to be latched onto the OUT port, q, of the latch. The OUT port will remain at '1' even when transitions back to '0'. The latch output can be reset to '0' by setting the value of the IN port, reset, to '1'. Note that the latch is edge triggered, not level-triggered.

Figure 2:
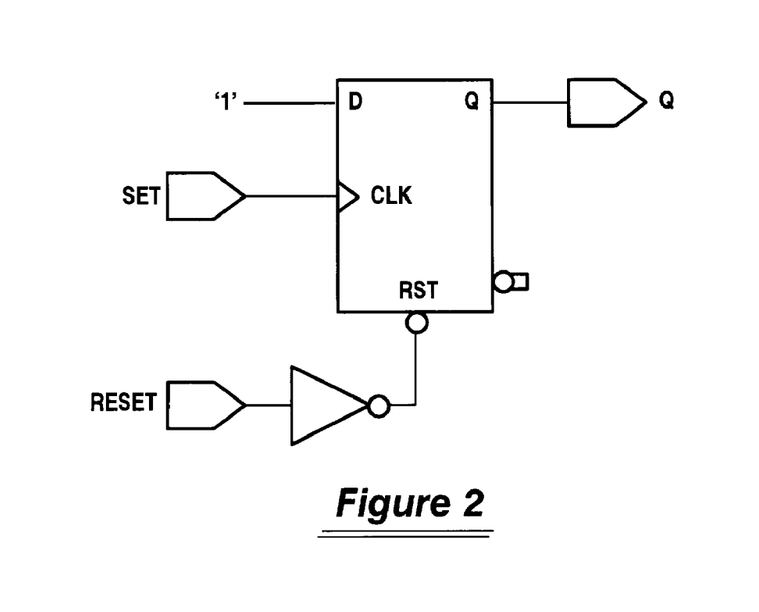
FIG. 2 is a block diagram.

The diagram showing the synthesised component from this code is seen in FIG. 2.

VNEMULATOR Trigger Latches

Instances of the library components VNEMULATOR_RTOGGLE and VNEMULATOR_FTOGGLE are used to latch the value of, respectively, a rising toggle-cover probe and a falling toggle-cover probe for a scalar signal of the IEEE logic type, std_ulogic.

A separate pair of components, VNEMULATOR_RTOGGLE_BOOL and VNEMULATOR_FTOGGLE_BOOL are used to latch toggle cover probes for signals of the standard type BOOLEAN.

The components VNEMULATOR_RTOGGLE_BIT and VNEMULATOR_FTOGGLE_BIT are used to latch toggle cover probes for signals of the standard type BIT.

The source code for the VNEMULATOR_RTOGGLE is shown below:

```
library ieee;
use ieee.std_logic_1164.all,
entity VNEMULATOR_RTOGGLE is
    port (
        reset :in bit;
        s :in std_logic;
        q :out bit
    );
end;
architecture RTL of VNEMULATOR_RTOGGLE is
begin
    state_p : process (reset, s)
    begin
        if reset = '1' then
            q <= '0';
        elsif s'event and s = '1' then
            q <= '1';
        end if;
    end process;
end;
```

The functionality of the latch is such that a transition to '1' on the IN port, s, causes a '1' to be latched onto OUT port, q, of the latch. The OUT port, q will then remain at '1' even when s transitions back to '0'. The latch is therefore capable of recording the fact that a rising toggle (ie. rising edge) occurred on a signal attached to its port, s.

The latch output can be reset to '0' by setting the value of the IN port, reset, to '1'.

The component, VNEMULATOR_RTOGGLE, works in a similar way but records a falling edge on its IN port, s.

The above two components can be used to provide toggle coverage for signals of subtype STD_LOGIC.

The remaining 4 components provide the same functionality for signals of type BOOLEAN and BIT.

VNEMULATOR_DECLARATIONS Package

The package contains the component declarations for the design units discussed above. In addition, it contains a resolved subtype of the standard type BIT called resolved_or_bit. In VHDL terms, the value of a signal declared with this subtype is evaluated as the OR of the signal's drivers. Signals of this subtype are used to implement branch coverage for branches enclosed in for-generate loops.

Using the Library Components; Branch Probe Implementation (Preferred Embodiment Instrumentation).

Many types of conditional control structures in VHDL and Verilog control the execution of sequential statements. Branch probes record which conditionalized statements get executed. Branch probe definition of the SLATCH entity and architecture, and its instantiation are shown below.

Standard Branch Probe

The following VHDL shows a process containing an if-statement. When the if-expression, en='1', evaluates to true, the if-branch is taken, and the statement 'q<=d' is executed. When the expression evaluates to false, a virtual else-branch is taken. In coverage terms, the virtual else-branch is referred to as a 'missing-else' branch.

```
library ieee;
use ieee.std_logic_1164.all;
entity BRANCH_EXAMPLE is
    port (
        d :in std_logic;
        en :in std_logic;
        q :out std_logic
    );
end;
```

```
architecture RTL of BRANCH_EXAMPLE is
begin
    PROC_1: process(en, d)
    begin
        q <= '0';
        if en = '1' then
            q <= d;
        end if;
    end process;
end;
```
Note that without the "q" do loop in the BRANCH_EXAMPLE, when this VHDL example is instrumented for branch, coverage, the following VHDL is produced.
```
library ieee;
use ieee.std_logic_1164.all;
library vnemulator;
entity BRANCH_EXAMPLE is
    port (
        d :in std_logic;
        en :in std_logic;
        q :out std_logic
    );
end;
-- synopsys translate_off
library vnvhdl; use vnvhdl.vnvhdl.all; -- For VN-Cover PLI
-- synopsys translate_on
library vnemulator; use vnemulator.vnemulator_declarations.all;
architecture RTL of BRANCH_EXAMPLE is
    signal t_vncover_b_1 : bit;
    signal vncover_eb_1 : bit;
    signal t_vncover_b_0 : bit;
    signal vncover_eb_0 : bit;
    signal t_vncover_reset : bit;
    -- synopsys translate_off
    signal vhdlcover_id : integer :=-1; -- For VN-Cover PLI
    for all : vnemulator_slatch use entity vnemulator.vnemulator_slatch(rtl);
        for all : vnemulator_trigger use entity vnemulator.vnemulator_trigger(rtl);
        for all : vhdlcover_probe0 use entity vnvhdl.vhdlcover_probe0;
    -- synopsys translate_on
begin
    -- synopsys translate_off
        -- For VN-Cover PLI
        transeda101: vhdlcover_probe0 generic map(-1,
            "./vnavigator_files/BRANCH_EXAMPLE-RTL-.control",
    3, 1);
    -- synopsys translate_on
    PROC_1 : process(en, d)
    begin
        t_vncover_b_0 <= '0';
        t_vncover_b_1 <= '0';
        q <= '0';
        if en = '0' then
            t_vncover_b_0 <= '1';
            q <= d;
        else
            t_vncover_b_1 <= '1';
        end if;
    end process;
    vncover_trigger : vnemulator_trigger port map(t_vncover_reset);
    vncover_b_0 : vnemulator_slatch port map(t_vncover_reset,
        t_vncover_b_0, vncover_eb_0);
    vncover_b_1 :vnemulator_slatch port map(t_vncover_reset,
        t_vncover_b_1, vncover_eb_1);
end;
```
VHDL that is not in general supported for synthesis is enclosed in pragma comments that cause the synthesis tool to ignore it.

Lines marked with the comment '-- For VN-Cover PLI' are required for the generation of the history template file. The vnvhdl library (not defined here) is the standard TransEDA library of components used to support code coverage on a logic simulator. An instance of a vnvhdl component, vhdlcover_probe0, is inserted into the design. This component is declared in the vnvhdl library as a foreign model and is bound to a C function in the VN-Cover PLI attached to the logic simulator. At the start of simulation, this C function is invoked for each instance of the BRANCH_EXAMPLE module in the design. In this way instances of instrumented module register themselves with the VN-Cover PLI. The PLI can then write the template history file containing the cover-probe information for the design.

The instrumented code contains two branch probes. The first records whether the if-branch in the process, PROC_1, was ever taken during a simulation, the second whether the missing else-branch was ever taken.

For the if-branch, a BIT signal, t_vncover_b_0 is declared. It is initialized to '0' at the top level of the process so that the assignment to '1' inside the if-branch does not infer a latch in the synthesis process. This signal is also attached to the IN port, s, of the VNEMULATOR_SLATCH instance, vncover_b_0.

If the if-branch is executed during a simulation, the value of this signal is driven to '1'. This rising edge causes the vncover_b_0 latch instance to latch a '1', ie. it captures the fact that the if-branch was taken.

In a similar way, the vncover_b_1 latch records whether the missing else-branch was ever taken.

The OUT port of the VNEMULATOR_TRIGGER instance is attached to the reset port of both latch instances. The user can force both latches to reset by forcing the value of the trigger's OUT port high.

Figure 3:
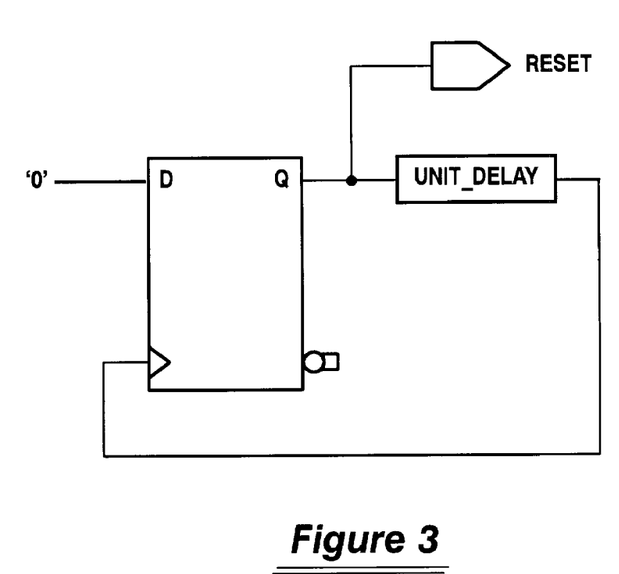
FIG. 3 is a block diagram.
Figure 4:
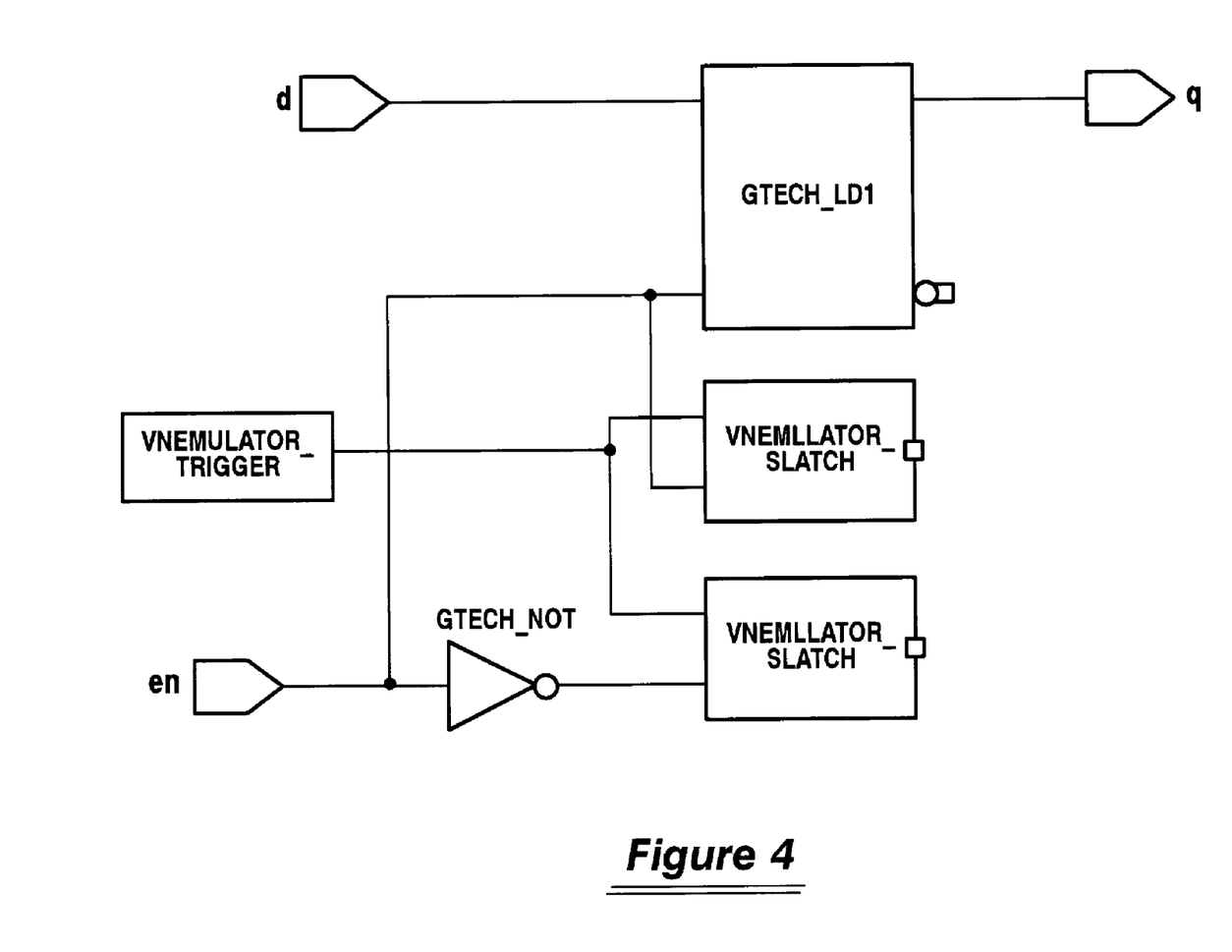
FIG. 4 is a block diagram.

The diagram of FIG. 3 shows the synthesised logic for the instrumented example above. (Note that GTECH_LD1 is inferred logic). The outputs form the two BNEMULATOR_SLATCHs hold the coverage values for the two inserted branch probes, where a value 0 indicates the "uncovered" state for the branch probe and the value 1 represents the covered state. It is these values that are read by the extraction script.

For-Generate Handling

For a branch inside a for-generate statement, branch coverage is defined as follows: the branch is said to be covered if the branch was executed in any iteration of the for-generate statement.

The following VHDL example shows a branch inside a for-generate statement.
```
library ieee;
use ieee.std_logic_1164.all;
entity FOR_GEN_BRANCH is
    port (
        d :in std_logic_vector(1 downto 0);
        en :in std_logic_vector(1 downto 0);
        q :out std_logic_vector(1 downto 0)
    );
end;
architecture RTL of FOR_GEN_BRANCH is
```

```vhdl
begin
    GEN_1 : for i in 1 downto 0 generate
        PROC_1 : process(en, d)
        begin
            q(i) <= '0';
            if en(i) = '1' then
                q(i) <= d(i);
            end if;
        end process;
    end generate;
end;
```

When instrumented, the following VHDL is produced. It is presented here in slightly simplified form to make the relevant details clearer.

```vhdl
library ieee;
use ieee.std_logic_1164.all;
library vnemulator;
entity FOR_GEN_BRANCH is
    port (
        d :in std_logic_vector(1 downto 0);
        en :in std_logic_vector(1 downto 0);
        q :out std_logic_vector(1 downto 0)
    );
end;
library vnemulator; use vnemulator.vnemulator_declarations.all;
architecture RTL of FOR_GEN_BRANCH is
    signal t_vncover_b_1 : vnemulator_or_bit;
    signal vncover_eb_1 : bit;
    signal t_vncover_b_0 : vnemulator_or_bit;
    signal vncover_eb_0 : bit;
    signal t_vncover_reset : bit;
begin
    GEN_1 : for i in 1 downto 0 generate
        PROC_1 : process(en, d)
        begin
            t_vncover_b_0 <= '0';
            t_vncover_b_1 <= '0';
            q(i) <= '0';
            if en(i) = '1' then
                t_vncover_b_0 <= '1';
                q(i) <= d(i);
            else
                t_vncover_b_1 <= '1';
            end if;
        end process;
    end generate;
    vncover_trigger : vnemulator_trigger port map (t_vncover_reset);
    vncover_b_0 : vnemulator_slatch port map (t_vncover_reset,
        t_vncover_b_0, vncover_eb_0);
    vncover_b_1 : vnemulator_slatch port map (t_vncover_reset,
        t_vncover_b_1, vncover_eb_1);
end;
```

Each iteration of the generate statement produces a copy of the process contained in it. Each copy of the process contains a driver onto the signals t_vncover_b_0 and t_vncover_b_1, so in the above example, each signal has two drivers. In contrast to the standard branch example above, these signals are declared to be of the subtype vnemulator_or_bit, declared in the VNEMULATOR_DECLARATIONS package. When any one of the drivers of this signal has the value '1', then the resolved value of the signal is '1'. This conforms to the definition of branch coverage inside for-generate loops as defined above.

Figure 5:
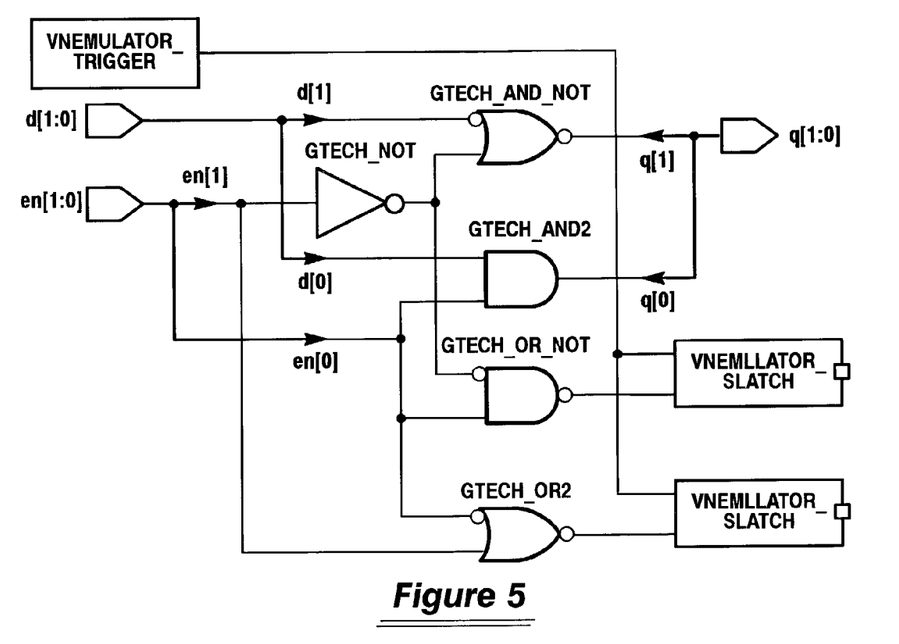
FIG. 5 is a block diagram.

The diagram of FIG. 5 shows the synthesised logic for the instrumented example above. Again, we have the VNEMULATOR_TRIGGER input and the two VNEMULATOR_SLATCHs for output.

Branch in for-Loop Handling

For a branch inside a for-loop statement, branch coverage is defined as follows: the branch is said to be covered if the branch was executed in any iteration of the for-loop statement.

The following VHDL example shows a branch inside a for-loop statement.

```vhdl
library ieee;
use ieee.std_logic_1164.all;
entity FOR_LOOP_BRANCH is
    port (
        d :in std_logic_vector(1 downto 0);
        en :in std_logic_vector(1 downto 0);
        q :out std_logic_vector(1 downto 0)
    );
end;
architecture RTL of FOR_LOOP_BRANCH is
begin
    PROC_1 : process(en, d)
    begin
        q <= "00";
        for i in 1 downto 0 loop
            if en(i) = '1' then
                q(i) <= d(i);
            end if;
        end loop;
    end process;
end;
```

When instrumented, the following VHDL is produced. It is presented here in slightly simplified form to make the relevant details clearer.

```vhdl
library ieee;
use ieee.std_logic_1164.all;
library vnemulator;
entity FOR_LOOP_BRANCH is
    port (
        d :in std_logic_vector(1 downto 0);
        en :in std_logic_vector(1 downto 0);
        q :out std_logic_vector(1 downto 0)
    );
end;
library vnemulator; use vnemulator.vnemulator_declarations.all;
architecture RTL of FOR_LOOP_BRANCH is
    signal t_vncover_b_1 : bit;
    signal vncover_eb_1 : bit;
    signal t_vncover_b_0 : bit;
    signal vncover_eb_0 : bit;
    signal t_vncover_reset : bit;
begin
    PROC_1 : process(en, d)
    begin
        t_vncover_b_0 <= '0';
        t_vncover_b_1 <= '0';
        q <= "00",
        for i in 1 downto 0 loop
            if en(i) = '1' then
                t_vncover_b_0 <= '1';
                q(i) <= d(i);
            else
                t_vncover_b_1 <= '1';
            end if;
        end loop;
``` end process;
vncover_trigger : vnemulator_trigger port map (t_vncover_reset);
vncover_b_0 : vnemulator_slatch port map (t_vncover_reset,
   t_vncover_b_0, vncover_eb_0),
vncover_b_1 : vnemulator_slatch port map (t_vncover_reset,
   t_vncover_b_1, vncover_eb_1);
end;

The signals t_vncover_b_0 and t_vncover_b_1 have each only one driver. During the synthesis process, the for-loop is unrolled producing (in this case) two iterations of the logic contained in it, ie for i=0 and for i=1. The logic produced is such that the signal takes the value '1' if it is assigned the value '1' in any of the unrolled loop iterations. This conforms to the definition of branch coverage inside for-loops as defined above.

Figure 6:
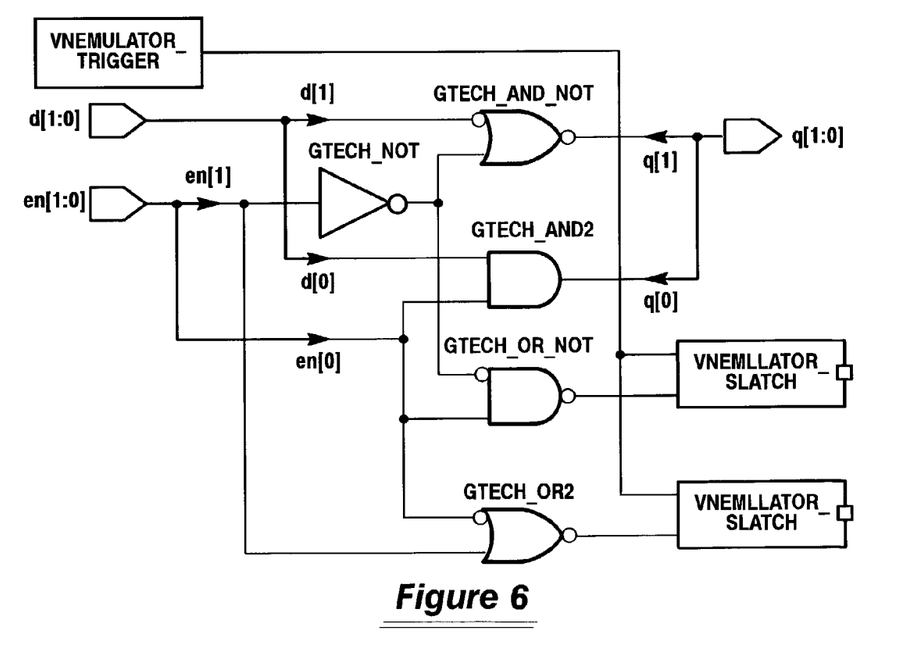
FIG. 6 is a block diagram.

The diagram of FIG. 6, which is identical to the diagram of FIG. 5 because this code generates the same synthesised logic for the instrumented example just above.

Statement Probe Feature Implementation

One of the instrumentation options is "statement probes". Each statement in the module being instrumented is associated with a statement probe that is activated when that statement is executed in simulation. "Statement" is a general term that includes VHDL processes. When a process is instrumented a statement probe is inserted at the top of the process. In simulation, this probe is activated when the any of the signals in the sensitivity list of this probe change. (A sensitivity list is a list of gates that are affected by the output of some other circuit. They are "sensitive" to changes in signal from such other circuits. An example might be where a signal p1 is valued as <p2 AND p3, thus making p1 sensitive to changes in value of either p2 or p3 or both). Synthesis tools do not provide a way to handle sensitivity lists and as a result, statement probes are "optimized" in the prior art by being tied high when the instrumented VHDL is synthesized. The following statement probe implementation overcomes the problem of the VHDL sensitivity list not being synthesizable by storing the initial value of all of the signals in the sensitivity list and by providing a comparison mechanism to cause the stateprobe to activate when the current and initial value of the sensitivity list are not equal. The design also provides a reset mechanism to allow the collected data to be reset after as needed. This feature could be used after an initialization sequence or to collect coverage data on individual tests in a long test suite.

Figure 7:
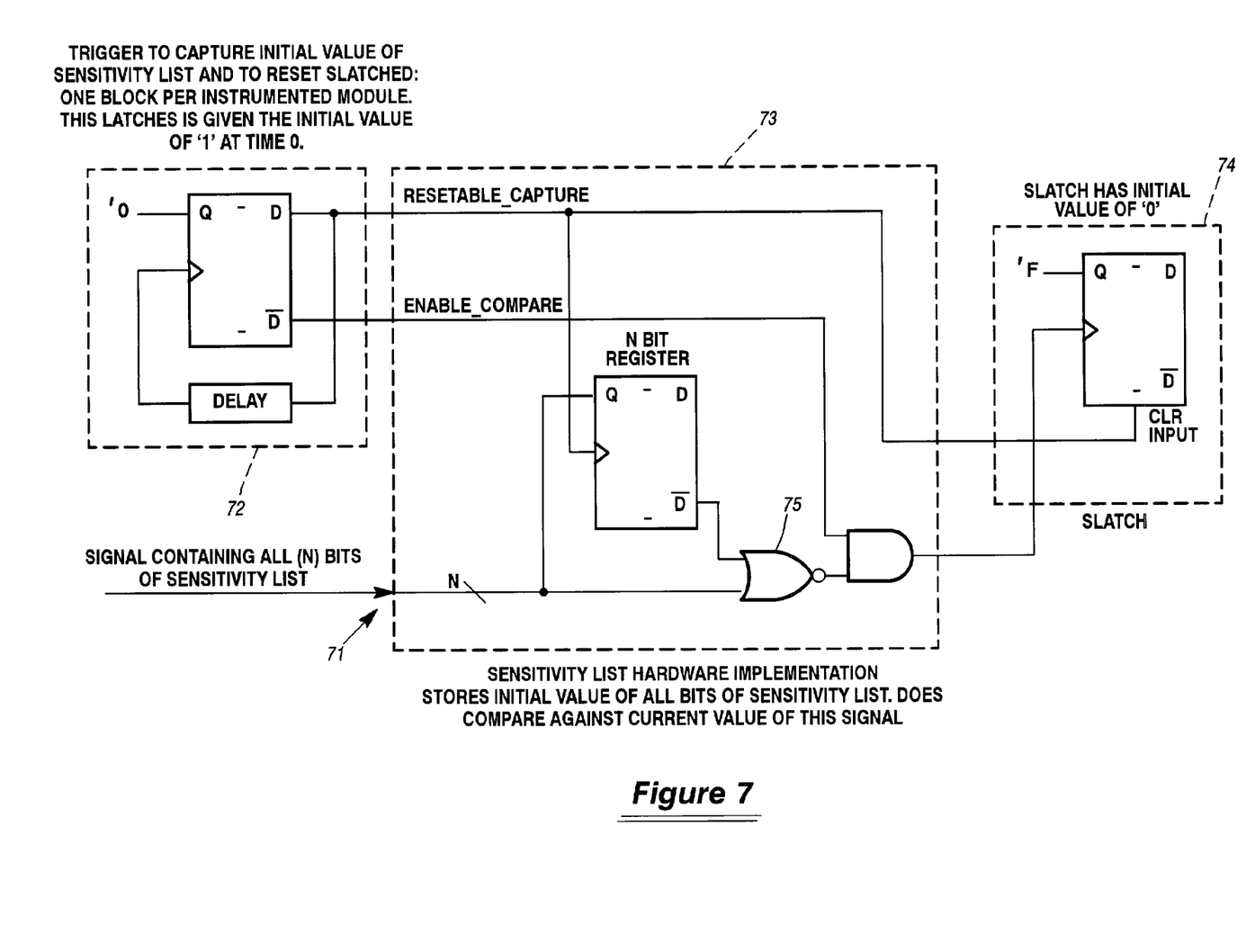
FIG. 7 is a block diagram.

The diagram of FIG. 7 shows the three parts of this implementation: 1) A trigger 72 that provides the control signals for the other parts, 2) the sensitivity list implementation (input 71 with a signal N bits wide containing all bits of the sensitivity list and circuit 73 using an N bit wide XNOR 75 for comparison with last latched in values) and 3) the slatch 74 that is set when the statement probe is activated. There is one trigger per instrumented module. The latch in this module is set initially. The logic automatically resets the latch after the shortest possible delay in CoBALT.

The sensitivity list hardware consists of

1) An N bit latch (where N is the total number of bits of the signals in the sensitivity list). This latch must be a level sensitive latch for the circuit to work correctly on cobalt.

2) A compare circuit that compares the current value of the sensitivity list signals to the captured value. The output of that compare is gated with the enable_compare signal. This signal is necessary so that a compare does not happen before the initial values are captured.

Initially, the latch module provides an active enable_capture signal and an inactive enable_compare signal (they are complements of each other). This causes the N bit latch to capture the initial value of the sensitivity list signals. It also causes the slatch coverage register to reset. After the delay, the enable_compare signal will become active which enables compare function.

VHDL for TRIGGER module:

```
entity VNEMULATOR_TRIGGER is
port (
    reset :buffer bit := '1';
    enable_compare : out bit
);
end;
architecture RTL of VNEMULATOR_TRIGGER is
signal delay_reset :bit;
signal reset_bar :bit;
component COBALT_UNIT_DELAY
port (
    A: in bit;
    Z: out bit
);
end component; -- COBALT_UNIT_DELAY
begin
UQ_DELAY : COBALT_UNIT_DELAY port map
    (A=>reset, Z=>delay_reset);
-- the reset state element below will be given an initial value
    of '1' on the emulator
process (delay_reset)
begin
    if delay_reset'event and delay_reset='1' then
        reset <= '0';
    end if;
end process;
enable_compare <= not reset;
end;
```

VHDL implementation for SENSITIVITY LIST HARDWARE implementation:

```
library ieee;
use ieee.std_logic_1164.all;
entity STMT_EXAMPLE is
port (
    p1 :out std_logic;
    p2, p3 :in std_logic
);
end;
architecture RTL of STMT_EXAMPLE is
signal vncover_es_0 : bit;
signal t_vncover_s_0 : bit;
signal t_vncoverc_p2 : std_logic;
signal t_vncoverc_p3 : std_logic;
signal reset, enable_compare : bit;
component vnemulator_trigger
    port (
        reset :buffer bit;
        enable_compare : out bit
    );
end component,
component VNEMULATOR_SLATCH
port (
    clear :in bit;
    s :in bit,
    q :out bit
);
```

```
end component;
begin
  t_vncover_trig : vnemulator_trigger port map (reset,
    enable_compare);
  vncover_s_0 : vnemulator_slatch port map (reset,
    t_vncover_s_0, vncover_es_0);
  process(p2, p3)
  begin
    p1 <= p2 and p3;
  end process;
  process(reset)
  begin
    if (reset'event and reset = '1') then
      t_vncoverc_p2 <= p2;
      t_vncoverc_p3 <= p3;
    end if;
  end process;
  process(enable_compare, p2, p3, t_vncoverc_p2, t_vncoverc_p3)
  begin
    assert false report "compare process woken up" severity
      note;
    t_vncover_s_0 <= '0';
    if enable_compare = '1' and
      (p2/=t_vncoverc_p2 or p3/= t_vncoverc_p3) then
      t_vncover_s_0 <= '1';
    end if;
  end process;
end;
```

Reset Trigger Implementation

Both branch and statement probes require that the SLATCH be reset to the "unencountered" state after the emulation run has been initialized. This is accomplished by the VNEMULATOR-TRIGGER circuit previously discussed.

This trigger circuit is instantiated in each instrumented module. The circuit is simply a latch with no input and one output. The output is tied to the reset signal of each instantiated SLATCH in that module. After the emulation run is initialized, it pauses and an external Tcl script is run which sets the internal latch of each trigger component, thereby resetting every SLATCH in the design.

Toggle Coverage Implementation

Figure 8A:
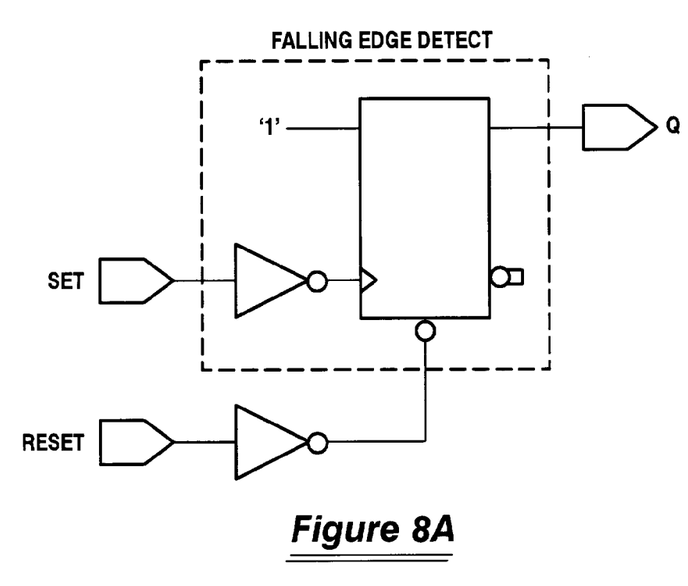
FIGS. 8A and 8B are block diagrams.
Figure 8B:
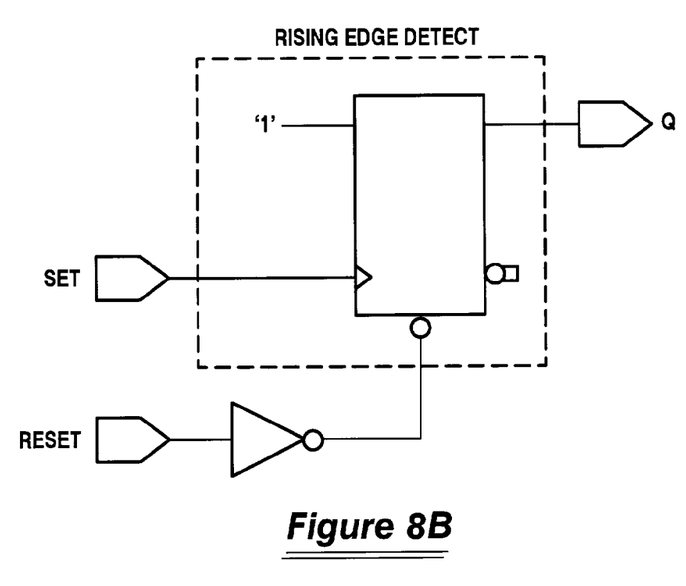

Another coverage option that needs a special implementation for CoBALT is "toggle" coverage. This coverage type checks to see if a given signal has made a high to low transition and a low high transition. The implementation consists of 2 components, where each component has the signal of interest as an input and has an edge triggered latch. The latch in one component is set when it sees a rising edge on the input signal, the other is set when it sees a falling edge. The following VHDL code and diagram show the implementation of the design. There is a version of the modules for signal bit inputs, bus inputs and Boolean signal inputs. We have found that toggle coverage on the output signal of a process provides a greater amount of information than the statement probe insert in the same processes because it shows that process has not only been activated but the signal is visited in both states. Refer to FIGS. 8A and 8B for diagrams of the falling edge detect triggered latch and the rising edge detect triggered latch, respectively.

Tie-High, Tie-Low, and Switches Coverage

This feature is described in detail in a patent filed on even date herewith entitled Identifying Specific Netlists and Finding Unexercised Logic for use in Code Coverage Testing U.S. application Ser. No. 10/324,608, now U.S. Pat. No. 7,117, 458, which shares one co-inventor with this patent. Generally, the multi-step method outlined below is a process that allows the probes that will not be exercised during the course of simulation due to gating by signals tied to constant values or signals controlled by "switches" to be identified so that they can be covered. It is:

1) The values of all registers to be used as switches for the given simulation are obtained.
2) The HDL code is synthesized to a gate level netlist that has simulation models available for the gates used in the netlist.
3) The netlist is brought into an event based simulator using the functional gate models. This necessary because netlists are synthesized without regard to process sensitivity lists. Using the normal HDL code in the simulation could result in erroneous results.
4) All inputs and register output are forced to the X state.
5) The switch registers are forced to their constant values.
6) All signals that are expected to be tied high or low must be in the expected state (Synthesis tools should instantiate logic_0 or logic_1 cells to give the proper values but in some cases where this does not happen this will need to done in the simulation).
7) Then the simulation is run and all probe signals are examined; any probe signals that do not have an X value are dependant only on switches or signals that are tied high or low and will not be exercised by any tests run on the simulation. Probe values of 1's would be marked as covered in the event-based simulator, value=0 are the probes that will never be entered because they are inaccessible due to the constant registers or tie-offs.

Figure 9:
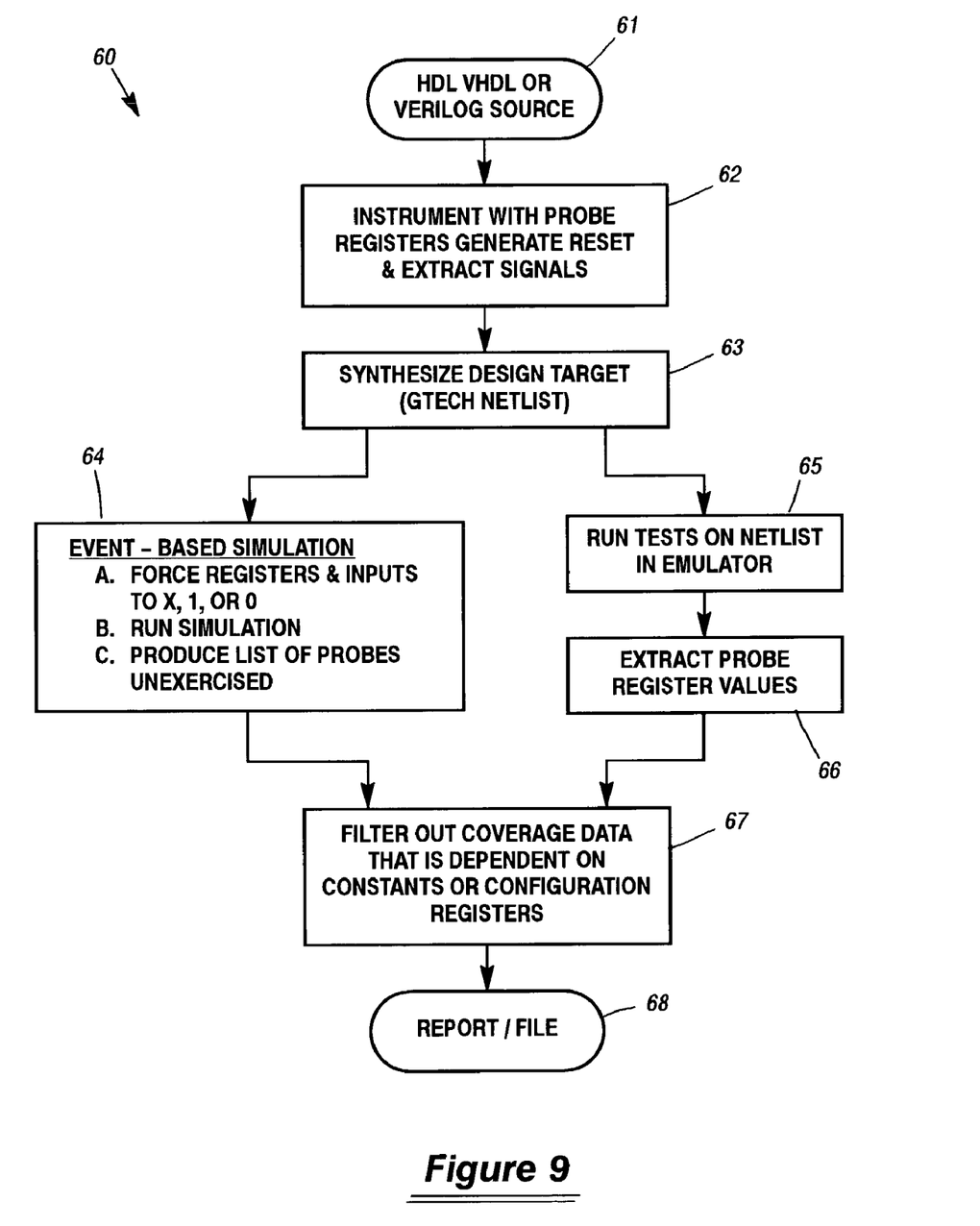
FIG. 9 is a flow chart illustrating steps for finding unexercised logic.

It can be illustrated more completely with reference to FIG. 9 in which the general process 60 for finding unexercised logic is described. We start with the source file 61, and instrument it 62 with probe registers for all the gates. In doing so the reset and extract signals and paths are also constructed, and all this can be done automatically with the software. Once this is completed, we synthesize the target netlist for the design 63, using our generic technology gates (GTECH), as mentioned earlier. At this point there are two branches, event based simulation and emulation testing of the netlist. From the first branch 64, we want to determine which gates are unexercised, producing a set of probes that have not changed their values from the initial value (C), and from the second 65, we want to extract the probe register values themselves (66). Then we can filter out coverage data that is dependent on constants or configuration registers (67), as we describe in step 7 of the outlined steps above. The final report or file will preferably have a list of uncovered circuits 68, from which a designer can assess the validity of the design, and do further testing. Logic unexercised due to constants can be modified to be more testable, or ignored, if it is only used for limited purposes and the purpose can be tested through reconfiguration of date inputs.

Naming Conventions

To avoid name clashes between identifiers in the original HDL and identifiers added to the HDL during instrumentation, the inserted identifiers will contain the string 'vncover'.

Temporary names, ie. names of objects that don't need to be accessed on the emulator, will have the prefix 't_vncover', the 't_' standing for 'temp'.

The labels of SLATCH instances (which hold coverage probes) are named as follows:

For statement probes :vncover_s_<int_id>
For branch probes :vncover_b_<int_id>
For rising toggle probes :vncover_tr_<int_id>
For falling toggle probes: vncover_tf_<int_id> where <int_id> is an integer representing the probe number, the lowest value being 0

Interfaces and File Formats for Preferred Embodiment Implementation in CoBALT

State Retrieval

After the instrumented design has been executed, the various state variable values must be retrieved to be analyzed. To retrieve a value on CoBALT, one could always use:

value <slatch_inst>.Q_REG

The Unisys Tcl shell translates this name (slatch_inst.Q_REG) to the real CoBALT name. A keepNets file would be required to retain the original port names. Then the same command could work on Leapfrog/NC-Sim and CoBALT:

value <slatch_inst>.Q

To make the extract script as resilient as possible we implement the above value using the Tcl "catch" construct that allows an errors with latch names to be trapped and reported:

Here is an example:

```
proc safe_value args {
    if {[catch {set result [value -dec $args]}] == 1} {
        puts "ERROR: value -dec $args failed"
        return 0
    }
    return $result
}
proc vncover_extract_slatch_values { } {
    if [catch {open emulator.values w} file] {
        puts stderr "Cannot open 'emulator.values' for writing"
        return
    }
    puts stderr "Writing coverage values to 'emulator.values'"
    puts $file "adder1.vncover_b__0 [safe_value adder1.vncover_b__0.q_REG]"
    puts $file "adder1.vncover_b__1 [safe_value adder1.vncover_b__1.q_REG]"
    puts $file "adder1.vncover_b__2 [safe_value adder1.vncover_b__2.q_REG]"
    puts $file "adder1.vncover_b__3 [safe_value adder1.vncover_b__3.q_REG]"
}
```

History Template File

Prior to running an instrumented design in CoBALT, the design is loaded into a software simulator so the hierarchical probe names can be retrieved. This hierarchy and the common prefix associated with each type of probe are stored in the header of the History Template file. History Template files are encapsulated standard History files, preceded by this header.

A Perl script is used to parse the History Template file and generate a Tcl script which is used to extract the probe values. A second Perl script then converts the output of the Tcl script into a standard History file for use by VN-Cover. The industry has several versions of files like this, but it is useful to understand how the one used here is set up, so this section is provided for that purpose. The History and History Template file formats are shown below.

The file format is line based. Elements on a line are separated by a single space.

Key:
  [ ]=optional elements
  { }=zero or more repetitions
  . . . =repeated element (or line if at start of line)
  <CR> newline character history_template_file ::=
  history_template_header
  augmented_format_3_history_file history_template_header ::=
  history_template_format: 2 <CR>
  user_comment: <text> <CR>
  probe_prefix_definitions
  probe_counts_line
  emulator_overhead_line
  0 0 0 0 0 0 0 0 0 0 <CR> Note 1
probe_prefix_definitions ::= Note 1a
  prefixes: <reset_trigger_label> <branch_prefix> \
    <falling_toggle_prefix> <rising_toggle_prefix> \
    <toggle_generate_prefix> <CR>
probe_counts line ::= Note 1b
  probe_counts: <reset_trigger_count> <branch_count>
    <toggle_count> <CR>
emulator_overhead_line ::= Note 1c
  overhead: <N> gates <N> latches <N>
augmented_format_3_history_file ::= Note 2
  format: 3 <CR>
  {run} Note 2a
run ::=
  run: <name> <CR> Note 2b
  start: <epoch_time> <CR> Note 3
  elapsed: <sim_time_in_secs> <CR> Note 3a
  <num_instances> <CR>
  {instance}
instance ::=
  instance_header
  instance_body
instance_header ::=
  <source_filename> <CR>
  <control_filename> <CR>
  <module_name> <CR> May be empty line
  <instance_name> <CR> May be empty line Note 3b
  3 <CR> Note 4
instance_body ::=
  stmt_probes
  branch_probes
  0 <CR> #0 excluded_probes Note 4a
  0 <CR> #0 path_probes
  0 <CR> #0 condition_items
  0 <CR> #0 trigger_probes
  0 <CR> #0 trace_probes
  toggle_probes
stmt_probes ::=
  <num_lines_to_follow> <CR>
  {<probe_id> <weight> <hit_count> <CR>} Note 5, 5a, 5b
branch_probes ::= Note 5b
  <num_lines_to_follow> <CR>
  {<probe_id> <hit_count> <CR>}
toggle_data ::=
  <toggle_width> [left_bound right_bound] <CR> Note 6
  <probe_id> <CR> Note 6a
  <neg_edge_hit_count> <pos_edge_hit_count> <CR> Note 6b
  . . . (until toggle_width)

Notes
-----

1. 10 flag-fields for unspecified future use.
1a. The probe names define the prefixes of the latch instances that represent probes. For example, if the branch probe prefix name is 'vncover_b_', then a latch instance label of 'vncover_b__0' represents branch probe 0. <trigger_label> defines the instance label of the trigger module in an emulator-instrumented module.
1b. The counts give the number of reset-trigger instances, branch probes and toggle probes in the complete design.

Note that statement probes are derived from branch probes are therefore NOT counted. The counts can be used to estimate the time required to extract probe values from the emulator at the end of simulation, or the time required to activate reset-trigger instances in order to reset coverage when the circuit has been initialized.

1c. The counts *estimate* the number of gates and latches added to the design by the coverage instrumentation.

2. This is not a pure history file format. It differs in the following:
The toggle signal width line has array bounds fields for array signals (see below).

2a. For the history template file, there will be one and only one 'run'.

2b. Run names may contains spaces and unusual characters. The name starts after 'run:' and extends to the end of the line. The run-name represents the top level module of the design, eg. 'ent:arch'.

3. epoch time is seconds since 1 Jan. 1970—a Unix timestamp. It represents the simulation start time.

3a. elapsed time is the length of the simulation. For emulators, we can use a token time of '1'.

3b. instance_name has the format:
<top_level_module>.<instance_label1>.<instance_label2>.< ... >
where <top_level_entity_name> is the name of the top level module (verilog) or entity/configuration (vhdl).

4. Emulator instrumentation is always instance based, hence this field always has the value '3'.

4a. For the time being, there will always be zero exclude, path, condition, trigger and trace probes in a history template file.

5. For statement and branch the probe_Ids are not necessarily consecutive. Statement and branch probes share the same probe-number namespace, ie stmt may have probe ids, 1 and 2; branch ids, 0, 1 and 2. Note that there is a statement probe with id 1, and a branch probe with the same id. This is because for emulator coverage, statement probes are always inferred from branch probes.

Consider the following hdl code:
if(a == 1)
  stmt1

Here a branch probe within the 'if' statement can be used also to detect whether stmt1 was executed. No instrumentation is added for the statement probe. The statement probe does exist in the history file however, and its value is the value of the corresponding branch probe.

A branch probe inserted to represent the missing 'else' does not represent a statement probe. Hence here we would have one statement probe with id 0, and 2 branch probes with id's 0 and 1. Note that probe id 0 is shared—it is both a statement and a branch probe.

5a. For stmt probes, the weight is the number of statements in the source-code block, eg. if the weight is 4, then the statement probe represents 4 statements.

5b. For a template history file, the hit-count is an integer. The value of the integer is ignored. (This way, we can hand generate a history template file from a history file simply by adding an extra header.)

6. The toggle width is the width of the signal, ie. 1 for scalar signals and the value of <signal> 'length for array signals. The left and right array bounds are specified for array signals only. NB: array bounds are present only in the history template file, not in a standard history file.

6a. Toggle probe ids start at 0. Under certain circumstances, a probe id may be missing, eg. the following sequence of probe is possible: 0, 1, 3, 4

6b. For a toggle_data, the toggle width determines the number of lines that follow the probe id. Each line has 2 hit-counts, (falling and rising edge toggle) that together represent one toggle probe. For array signals, the first line always represents the element of the array with the highest index; the last line represents the element of the array with the lowest index.

What is claimed is:

1. A computer-implemented method of providing code coverage testing for use in emulation of a logic circuit design having a plurality of logic gates, the logic design represented as a plurality of modules in a source code design file, the method comprising:
instrumenting a selected module of the source design file with coverage probes by instantiating a probe for each gate output;
generating a hierarchical name list comprising a hierarchical name for each instantiated probe;
generating a history template file from the hierarchical name list;
compiling/synthesizing the instrumented source file into an instrumented gate-level netlist;
generating two scripts using the list of hierarchical names from the history template file, wherein the two scripts comprise a reset trigger script and a probe value extraction script;
loading the instrumented gate-level netlist onto a hardware emulator;
initializing an emulation run and executing the reset trigger script to reset all branch and statement probes;
driving the fully initialized design in emulation by a simulated testbench;
running the generated extraction script to retrieve the probe values from
the testbench emulation, wherein the retrieved probe values are used in code coverage testing;
generating a temporary file to hold the retrieved probe values;
populating the temporary file with the retrieved probe values;
merging the history template file with the retrieved probe values from the temporary file to produce a first history file;
finding unexercised logic using the instrumented gate-level netlist and generating a second history file;
merging the first history file with the second history file to produce code coverage results; and
producing a code coverage tool report using the code coverage results.

2. The method of claim 1 further comprising, saving the extracted probe values in a valid input format for use by a code coverage tool.

3. The method of claim 2 further comprising, examining said extracted probe values in said code coverage tool to determine which instantiated probe outputs are unexercised.

4. The method of claim 3 further comprising, producing, by the code coverage tool, reports that detail an amount of the design that has been exercised.

5. The method of claim 1 wherein an appropriately sized module is selected for said source design file.

6. The method of claim 1 wherein there are three types of probes instantiated, branch probes, statement probes, and toggle probes.

7. The method of claim 6 wherein at least one instantiated probe is a statement probe and wherein said statement probe is activated when the any signal in a sensitivity list of said at least one instantiated statement probe change.

8. The method of claim 7 wherein said sensitivity list is a list of gates that are affected by the output of at least one other gate.

9. The method of claim 8 wherein said sensitivity list has also stored an initial value of all signals in the sensitivity list for said at least one instrumented statement probe, and by providing a comparison mechanism to cause said at least one instrumented statement probe to activate when the current and initial value of the sensitivity list are not equal.

10. The method of claim 6 wherein said trigger probe is instantiated once per instrumented module and is provided with one control port to all other instrumented probes in the module design file.

11. The method of claim 10 wherein said trigger probe provides a reset signal to all resettable instrumented probes.

12. The method of claim 10 wherein said trigger probe provides an enable_capture/enable_compare signal pair for statement probe instantiations.

13. The method of claim 6 wherein said toggle probes checks whether a given signal received in a toggle probe instantiation has made a high to low transition and a low high transition.

14. The method of claim 13 wherein implementation of a toggle probe comprises the use of two components, wherein each component has a signal of interest as an input and has an edge triggered latch, and wherein the latch in one component is set by a rising edge on its input signal, and wherein the other is set by a falling edge on its input signal.

15. A code coverage tool as set forth in claim 1 having one or more of the following:
Branch coverage for use including one or more of the following types of branch coverage, standard, for-generate, and for-loop, Statement coverage, A reset trigger, and Toggle coverage.

16. A computer-implemented method of employing code coverage testing of a logic circuit design comprising a plurality of logic gates, the logic design represented as a plurality of modules in a source code design file, the method comprising:
using a design source file and instrumenting the design with coverage probes;
generating a hierarchical name list comprising a hierarchical name for each instantiated probe;
generating a history template file from the hierarchical name list;
compiling/synthesizing the instrumented design source file into a gate-level netlist, the list of hierarchical names from the history template file is used to generate two scripts comprising a reset trigger script to initiate coverage testing and a probe extraction script;
generating a temporary file to hold extracted probe values;
running the gate-level netlist in a hardware emulator with the two scripts saving the extracted probe values in the temporary file;
merging the history template file and the extracted probe values from the temporary file to produce a first history file;
finding uncovered logic using the gate-level netlist and generating a second history file;
merging the first history file with the second history file to produce code coverage results having a valid input format for use by a code coverage tool; and
producing reports by the code coverage tool.

17. The method of claim 16 wherein at least one of said reports produced by said code coverage tool wherein unexercised logic is identified.

18. A software storage disk comprising computer-executable operating instructions adapted to configure a computer system already capable of running a hardware emulation of a logic circuit design as a code coverage tool when loaded into said computer system, when said computer system is so configured, being operable as a code coverage tool during running of said hardware emulation and in such operation, determining which logic being so emulated is covered, and specifically wherein the operating instructions comprise instructions which, when executed, perform operations comprising:
instrumenting a design source file with instantiated coverage probes generating an instrumented design source file;
generating a hierarchical name list comprising a hierarchical name for each instantiated probe;
generating a history template file from the hierarchical name list;
compiling/synthesizing the instrumented design source file into a gate level netlist, the hierarchical name list names from the history template file used to generate two scripts comprising a reset trigger script to initiate coverage testing and a probe extraction script;
generating a temporary file to hold extracted probe values;
running the gate-level netlist in a hardware emulator with the two scripts saving the extracted probe values in the temporary file;
merging the history template file and the extracted probe values from the temporary file to produce a first history file;
finding uncovered logic using the gate-level netlist and generating a second history file;
merging the first history file with the second history file to produce code coverage results having a valid input format for use by a code coverage tool; and
producing reports by the code coverage tool.

* * * * *